(12) United States Patent
Vu et al.

(10) Patent No.: US 10,790,029 B2
(45) Date of Patent: *Sep. 29, 2020

(54) TEMPERATURE COMPENSATION IN MEMORY SENSING

(71) Applicant: MICRON TECHNOLOGY, INC., Boise, ID (US)

(72) Inventors: Luyen Vu, San Jose, CA (US); Kalyan C. Kavalipurau, Santa Clara, CA (US); Jae-Kwan Park, Cupertino, CA (US); Erwin E. Yu, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 50 days.

This patent is subject to a terminal disclaimer.

(21) Appl. No.: 16/111,319

(22) Filed: Aug. 24, 2018

(65) Prior Publication Data

US 2018/0366203 A1 Dec. 20, 2018

Related U.S. Application Data

(63) Continuation of application No. 15/248,692, filed on Aug. 26, 2016, now Pat. No. 10,127,988.

(51) Int. Cl.

| G11C 16/26 | (2006.01) |
| G11C 16/04 | (2006.01) |
| G11C 16/24 | (2006.01) |
| G11C 7/04 | (2006.01) |
| G11C 16/30 | (2006.01) |
| G11C 16/32 | (2006.01) |
| G11C 5/14 | (2006.01) |

(52) U.S. Cl.
CPC ............. *G11C 16/26* (2013.01); *G11C 7/04* (2013.01); *G11C 16/0483* (2013.01); *G11C 16/24* (2013.01); *G11C 16/30* (2013.01); *G11C 16/32* (2013.01); *G11C 5/145* (2013.01)

(58) Field of Classification Search
CPC .................................. G11C 7/04; G11C 16/26
See application file for complete search history.

(56) References Cited

U.S. PATENT DOCUMENTS

| 6,084,812 | A  | * | 7/2000  | Joo ........................ G11C 7/12 |
|           |    |   |         | 365/222 |
| 6,687,161 | B2 |   | 2/2004  | Marotta et al. |
| 7,630,266 | B2 |   | 12/2009 | Incarnati et al. |
| 9,147,480 | B2 |   | 9/2015  | Chen et al. |
| 9,165,664 | B2 |   | 10/2015 | D'Alessandro et al. |
| 9,478,261 | B1 |   | 10/2016 | Lim et al. |
| 10,127,988 | B2 | * | 11/2018 | Vu ........................ G11C 16/26 |
| 2002/0105831 | A1 |   | 8/2002  | Lee et al. |
| 2006/0221739 | A1 | * | 10/2006 | Kim ..................... G11C 16/24 |
|           |    |   |         | 365/203 |
| 2007/0008779 | A1 |   | 1/2007  | Isobe |
| 2010/0054068 | A1 | * | 3/2010  | Incarnati ............... G11C 5/143 |
|           |    |   |         | 365/211 |

(Continued)

*Primary Examiner* — Jay W. Radke
(74) *Attorney, Agent, or Firm* — Dicke, Billig & Czaja, PLLC

(57) ABSTRACT

Apparatus and methods to vary, in response to temperature, a precharge voltage level of a sense node during a sense operation, a sense node develop time during the sense operation, and/or a ratio of a deboost voltage level capacitively decoupled from the sense node to a boost voltage level capacitively coupled to the sense node during the sense operation.

17 Claims, 11 Drawing Sheets

(56) References Cited

U.S. PATENT DOCUMENTS

| | | |
|---|---|---|
| 2010/0074014 A1 | 3/2010 | Dunga et al. |
| 2010/0110815 A1* | 5/2010 | Lee .......................... G11C 7/04 |
| | | 365/211 |
| 2013/0155777 A1 | 6/2013 | Chen et al. |
| 2013/0194872 A1 | 8/2013 | Sim et al. |
| 2014/0269070 A1 | 9/2014 | Hsiung et al. |
| 2015/0340099 A1 | 11/2015 | Kwak |
| 2016/0189777 A1 | 6/2016 | Yoshihara et al. |
| 2018/0005696 A1* | 1/2018 | Kwon ................ G11C 16/0483 |

* cited by examiner

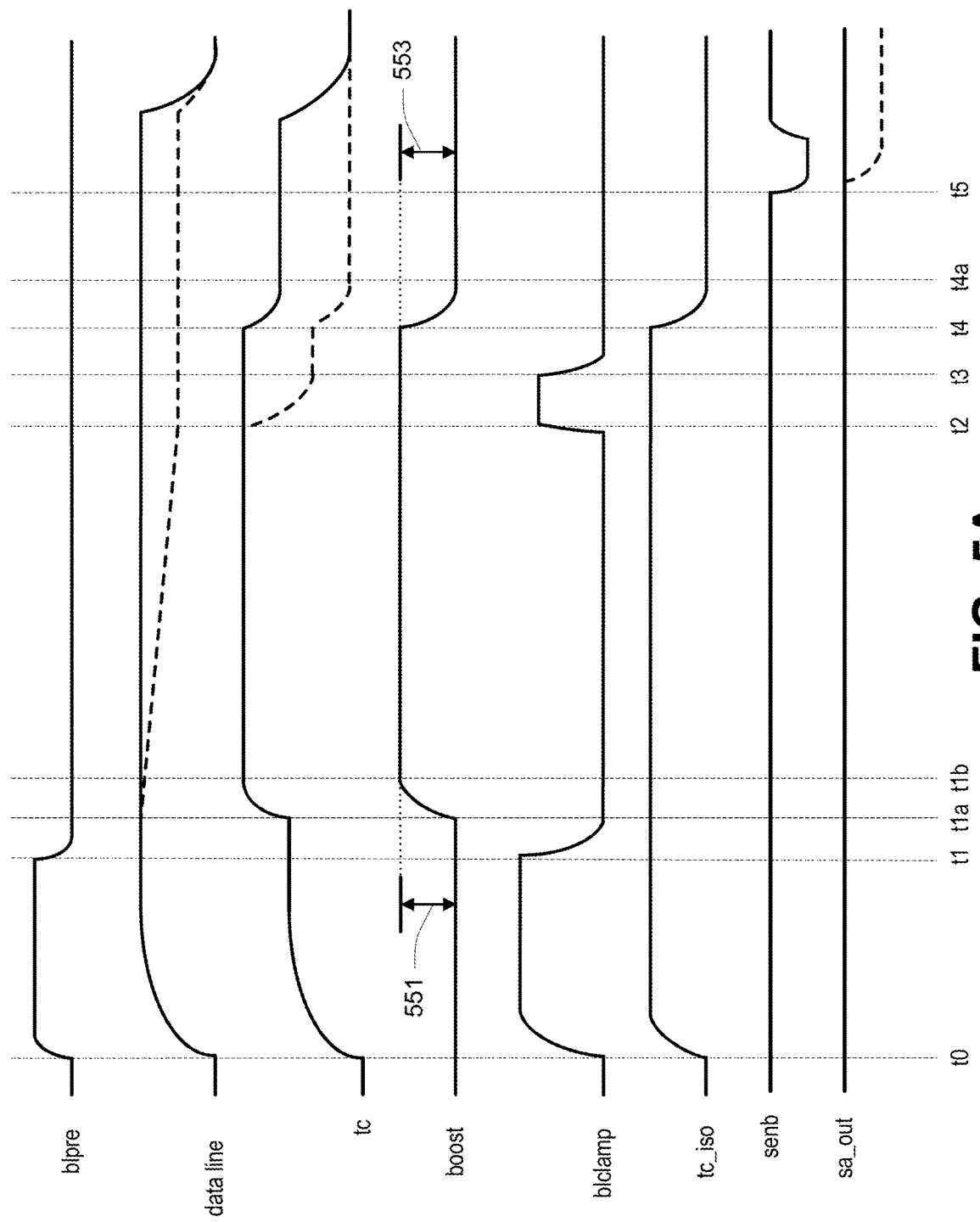

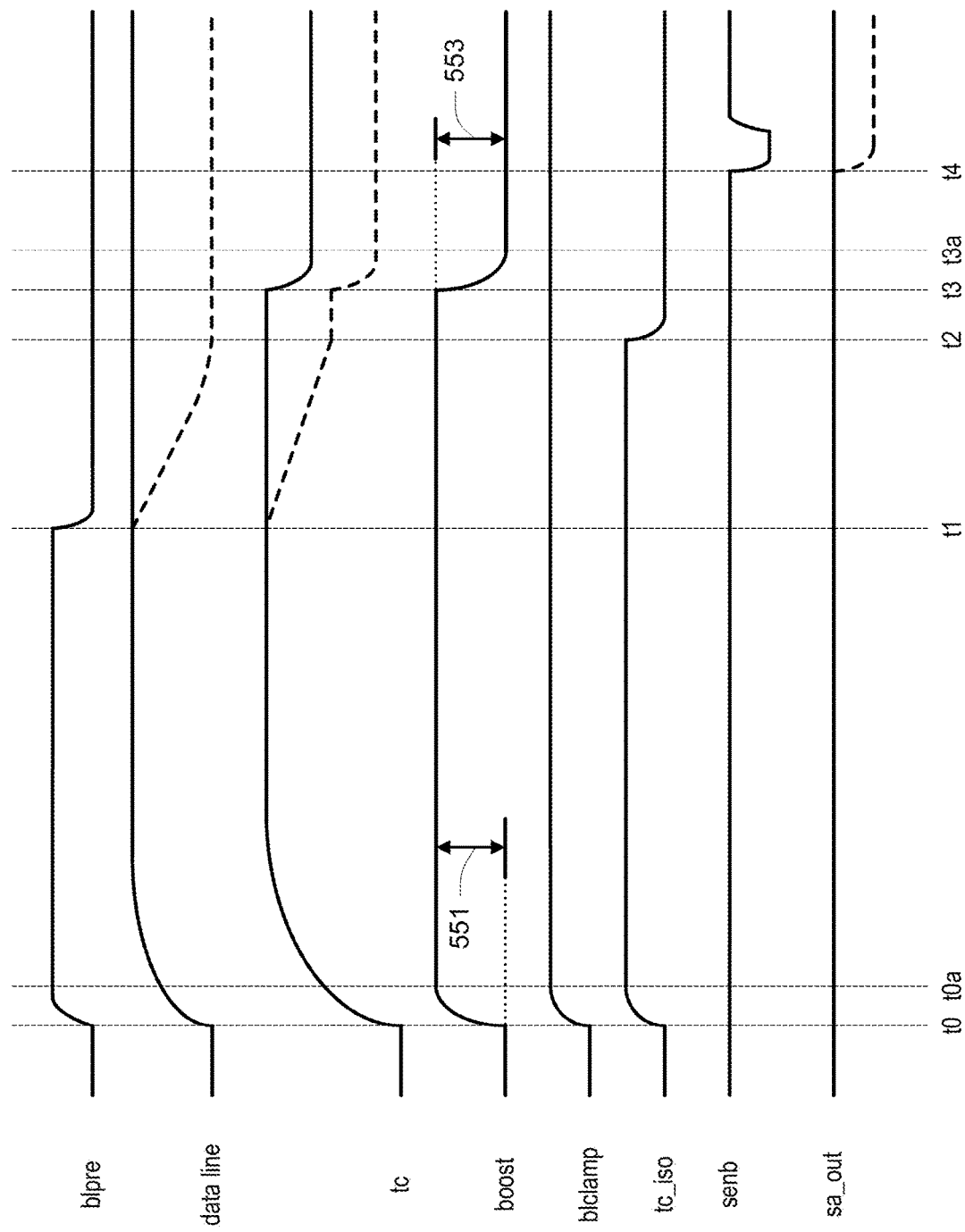

TEMPERATURE COMPENSATION IN MEMORY SENSING

RELATED APPLICATION

This Application is a Continuation of U.S. application Ser. No. 15/248,692, titled "TEMPERATURE COMPENSATION IN MEMORY SENSING," filed Aug. 26, 2016, issued as U.S. Pat. No. 10,127,988 on Nov. 13, 2018, which is commonly assigned and incorporated herein by reference.

TECHNICAL FIELD

The present disclosure relates generally to apparatus containing memory cells and methods of their operation, and, in particular, in one or more embodiments, the present disclosure relates to temperature compensation in memory sensing.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory include personal computers, personal digital assistants (PDAs), digital cameras, digital media players, cellular telephones, solid state drives and removable memory modules, and the uses are growing.

Sensing (e.g., reading or verifying) a data state of a memory cell often involves detecting whether the memory cell is activated in response to a particular voltage applied to its control gate, such as by detecting whether a data line connected to the memory cell experiences a change in voltage level caused by current flow through the memory cell. Circuitry used to detect such changes in voltage level are often affected by temperature variations. This can lead to an inaccurate determination of the data state of a sensed memory cell.

For the reasons stated above, and for other reasons stated below which will become apparent to those skilled in the art upon reading and understanding the present specification, there is a need in the art for alternative methods of operating memory, and apparatus to perform such methods.

BRIEF DESCRIPTION OF THE DRAWINGS

FIGS. 5A-5C are timing diagrams generally depicting a voltage level of various nodes of a sense circuit such as depicted in FIG. 3 at various stages of a sense operation in accordance with embodiments.

DETAILED DESCRIPTION

Figure 1:
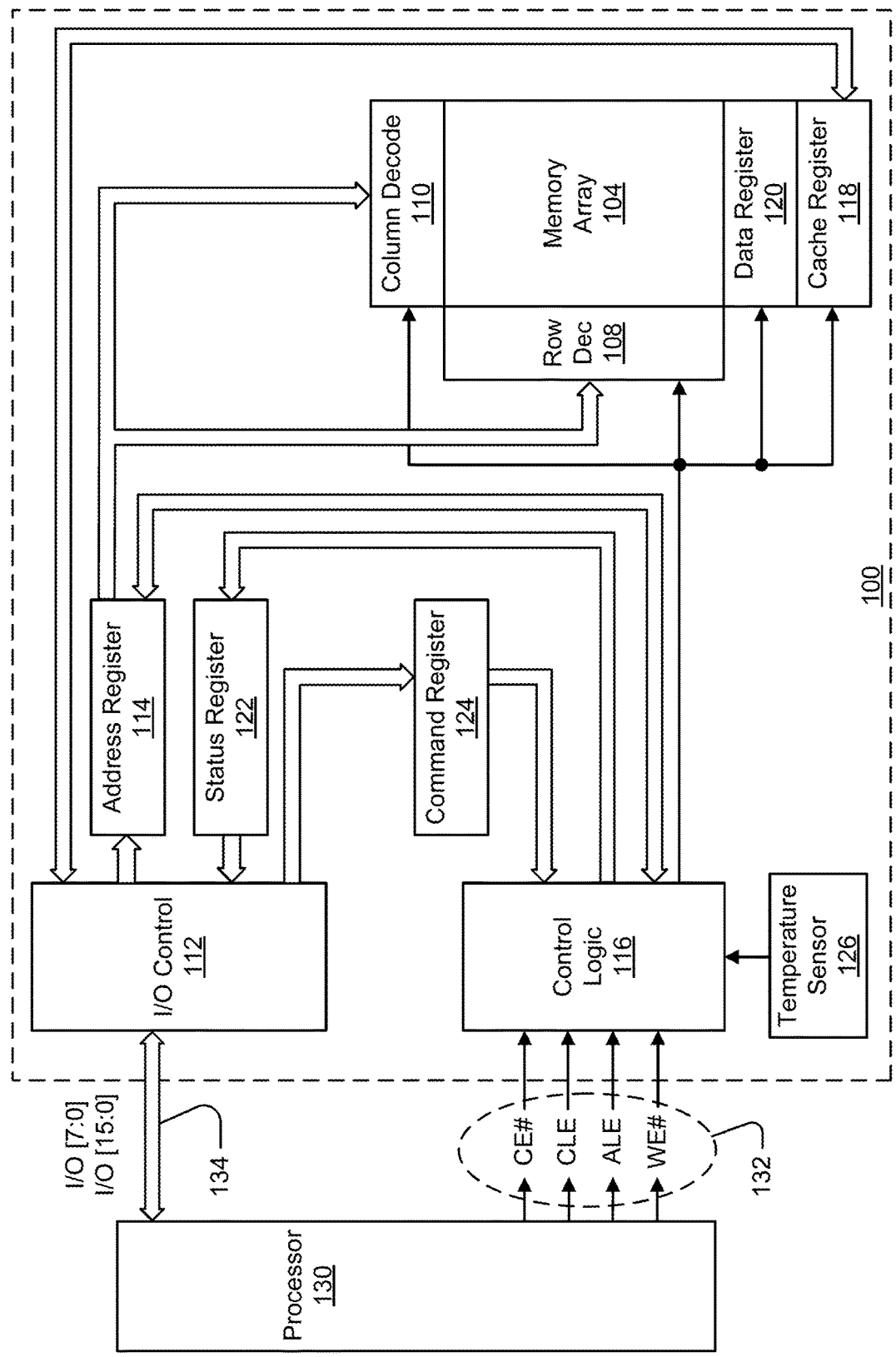
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

Sense operations (e.g., read or verify operations) may be utilized to determine a data state of a memory cell, which may be output from a memory (e.g., memory device) responsive to a read operation, or used to determine whether the memory cell has reached a desired data state during a program operation. Changes in temperature of the memory device can affect the operation of sense circuits used to determine the data state, which can lead to erroneous indications of the data state of the memory cell. Various embodiments facilitate compensation for temperature (e.g., temperature variations) by varying timing and/or voltage levels used during operation of a sense circuit and/or through alteration of the structure of the sense circuit itself.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, cellular telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., control logic 116 internal to the memory device 100) controls access to the array of memory cells 104 in response to the commands and generates status information for the external processor 130, i.e., control logic 116 is configured to perform access operations in accordance with embodiments described herein. The control logic 116 is in communication with row decode circuitry 108 and column decode circuitry 110 to control the row decode circuitry 108 and column decode circuitry 110 in response to the addresses. The control logic 116 is further in communication with temperature sensor 126. Temperature sensor 126 may sense a temperature of the memory device 100 and provide an indication to the control logic 116 representative of that temperature, such as some voltage or resistance level. Some examples of a temperature sensor 126 might include a thermocouple, a resistive device, a thermistor or an infrared sensor. Alternatively, temperature sensor 126 may be external to memory device 100 and in communication with the external processor 130. In this configuration, temperature sensor 126 may provide an indication of ambient temperature rather than device temperature. Processor 130 could communicate the indication representative of the temperature to the control logic 116, such as across input/output (I/O) bus 134 as a digital representation.

Control logic 116 is also in communication with a cache register 118. Cache register 118 latches data, either incoming or outgoing, as directed by control logic 116 to temporarily store data while the array of memory cells 104 is busy writing or reading, respectively, other data. During a program operation (e.g., write operation), data is passed from the cache register 118 to data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE #, a command latch enable CLE, an address latch enable ALE, and a write enable WE #. Additional control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of I/O bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2:
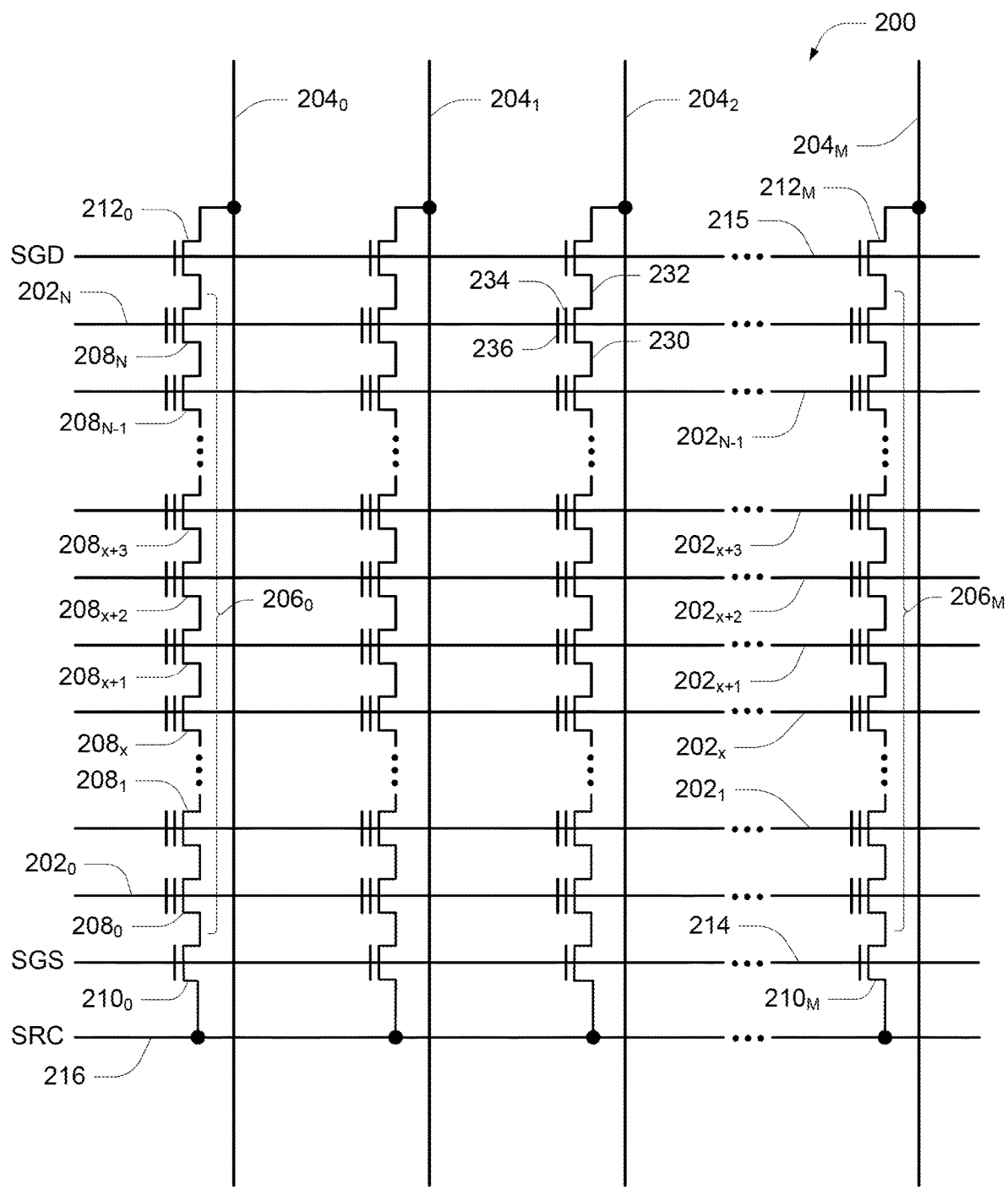
FIG. 2 is a schematic of a portion of an array of memory cells as could be used in a memory of the type described with reference to FIG. 1.

FIG. 2 is a schematic of a NAND memory array 200, e.g., as a portion of array of memory cells 104. Memory array 200 includes access lines, such as word lines $202_0$ to $202_N$, and data lines, such as bit lines $204_0$ to $204_M$. The word lines 202 may be connected to global access lines (e.g., global word lines), not shown in FIG. 2, in a many-to-one relationship. For some embodiments, memory array 200 may be formed over a semiconductor that, for example, may be conductively doped to have a conductivity type, such as a p-type conductivity, e.g., to form a p-well, or an n-type conductivity, e.g., to form an n-well.

Memory array 200 might be arranged in rows (each corresponding to a word line 202) and columns (each corresponding to a bit line 204). Each column may include a string of series-connected memory cells, such as one of NAND strings $206_0$ to $206_M$. Each NAND string 206 might be connected (e.g., selectively connected) to a common source 216 and might include memory cells $208_0$ to $208_N$. The memory cells 208 represent non-volatile memory cells for storage of data. The memory cells 208 of each NAND string 206 might be connected in series between a select transistor 210 (e.g., a field-effect transistor), such as one of the select transistors $210_0$ to $210_M$ (e.g., that may be source select transistors, commonly referred to as select gate source), and a select transistor 212 (e.g., a field-effect transistor), such as one of the select transistors $212_0$ to $212_M$ (e.g., that may be drain select transistors, commonly referred to as select gate drain). Select transistors $210_0$ to $210_M$ might be commonly connected to a select line 214, such as a source select line, and select transistors $212_0$ to $212_M$ might be commonly connected to a select line 215, such as a drain select line.

A source of each select transistor 210 might be connected to common source 216. The drain of each select transistor 210 might be connected to a memory cell $208_0$ of the corresponding NAND string 206. For example, the drain of select transistor $210_0$ might be connected to memory cell $208_0$ of the corresponding NAND string $206_0$. Therefore, each select transistor 210 might be configured to selectively couple a corresponding NAND string 206 to common source 216. A control gate of each select transistor 210 might be connected to select line 214.

The drain of each select transistor 212 might be connected to the bit line 204 for the corresponding NAND string 206. For example, the drain of select transistor $212_0$ might be connected to the bit line $204_0$ for the corresponding NAND string $206_0$. The source of each select transistor 212 might be connected to a memory cell $208_N$ of the corresponding NAND string 206. For example, the source of select transistor $212_0$ might be connected to memory cell $208_N$ of the corresponding NAND string $206_0$. Therefore, each select transistor 212 might be configured to selectively connect a corresponding NAND string 206 to a corresponding bit line 204. A control gate of each select transistor 212 might be connected to select line 215.

The memory array in FIG. 2 might be a quasi-two-dimensional memory array and might have a generally planar structure, e.g., where the common source 216, NAND strings 206 and bit lines 204 extend in substantially parallel planes. Alternatively, the memory array in FIG. 2 might be a three-dimensional memory array, e.g., where NAND strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determine a data state of the cell (e.g., through changes in threshold voltage), and a control gate 236, as shown in FIG. 2. In some cases, memory cells 208 may further have a defined source 230 and a defined drain 232. Memory cells 208 have their control gates 236 connected to (and in some cases form) a word line 202.

A column of the memory cells 208 is a NAND string 206 or a plurality of NAND strings 206 selectively connected to a given bit line 204. A row of the memory cells 208 are memory cells 208 commonly connected to a given word line 202. A row of memory cells 208 can, but need not include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not expressly depicted in FIG. 2, it is apparent from the figure that the bit lines 204 of the array of memory cells 200 may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page. The portion of a physical page (which, in some embodiments, could still be the entire row) that is read during a single read operation or programmed during a program operation (e.g., an upper or lower page memory cells) might be deemed a logical page.

In sensing (e.g., reading) a data state of a selected (e.g., target) memory cell, the memory cell is selectively activated in response to a particular voltage level applied to its control gate while current paths from the memory cell to the data line and to the source are established, thus permitting current flow, or lack thereof, between the data line and the source to indicate whether the memory cell has been activated in response to the particular voltage level applied to its control gate. For example, for a sensing operation of selected memory cell $208_{x+1}$ of NAND string $206_0$, a sense voltage (e.g., a read voltage or a verify voltage) could be applied to the control gate of memory cell $208_{x+1}$ while voltage levels are applied to the control gates of memory cells $208_0$ to $208_x$ and $208_{x+2}$ to $208_N$ of NAND string $206_0$ sufficient to activate those memory cells regardless of their data states, and while voltage levels are applied to the control gates of select transistors $210_0$ and $212_0$ sufficient to activate those transistors. Whether the memory cell $208_{x+1}$ is activated in response to the sense voltage may indicate one or more digits of the data state stored in that memory cell.

Although the example of FIG. 2 is discussed in conjunction with NAND flash, the embodiments and concepts described herein are not limited to a particular array architecture or structure, and can include other structures (e.g., cross-point memory, DRAM, etc.) and other architectures (e.g., AND arrays, NOR arrays, etc.).

Figure 3:
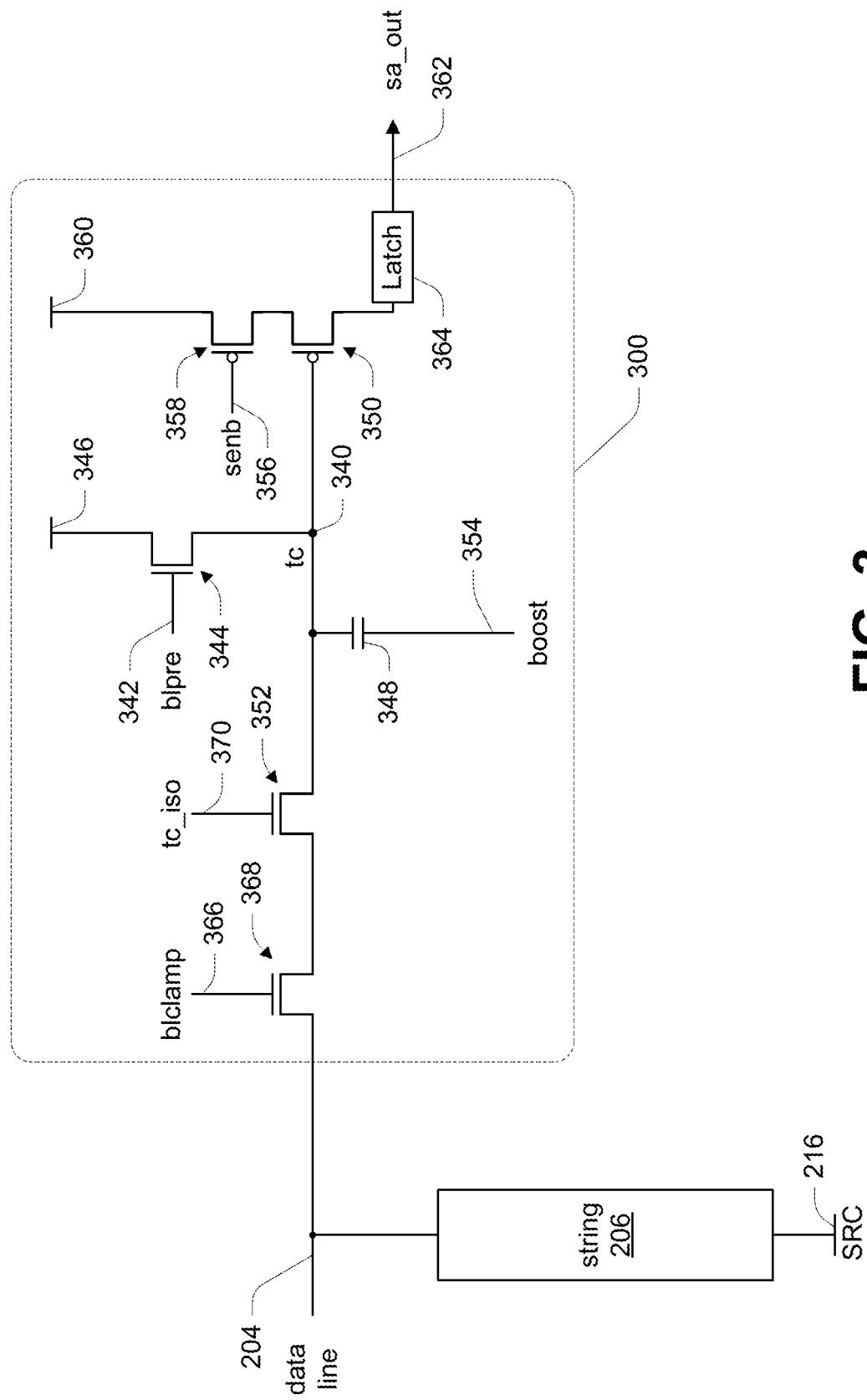
FIG. 3 is a schematic of a sense circuit for use with various embodiments

Sense circuits are typically utilized in memory devices to facilitate performing a sense (e.g., read and/or verify) operation on each of one or more selected (e.g., target) memory cells in the memory device. FIG. 3 illustrates a sense circuit 300 for use with various embodiments. Sense circuit 300 is shown connected to a particular NAND string 206 by a particular data line 204, such as shown in more detail in FIG. 2, for example. Note that select transistors 210 and 212 selectively connecting the NAND string 206 to the source 216 and data line 204, respectively, are not shown in FIG. 3. While the discussion is directed to use of the sense circuit 300 with a NAND string 206, other memory structures and architectures are suitable for use with sense circuit 300 where a current path can be selectively created from the data line 204 to the source 216 dependent upon a data state of a memory cell selected for sensing.

As part of a sense operation, e.g., a precharge portion, the sense circuit 300 may precharge a sense node (e.g., tc node) 340 by activating a precharge transistor (e.g., n-type field effect transistor, or nFET) 344 by biasing (e.g., driving) the signal line 342 to a particular voltage level (e.g., a voltage level of control signal blpre) sufficient to activate the transistor 344. Control signals of the sense circuit 300 may be provided by the internal controller (e.g., control logic 116) of the memory device 100. Such control signals (e.g., both voltage levels and timing) are defined by the sense operation and are distinguished from signals generated in response to performing the sense operation (e.g., the output signal sa_out or a voltage level generated on the sense node 340).

Transistor 344 is connected between a voltage node 346 and the sense node 340. Voltage node 346 might be configured to receive a supply voltage, e.g., Vcc. For some embodiments, voltage node 346 may be a variable voltage node. The capacitance 348 shown coupled to the sense node 340 may be representative of the capacitance at the sense node 340 and additional circuitry connected to it, e.g., transistors 344, 350 and 352. Voltage node 354 (e.g., a variable voltage node) is configured to apply a voltage level to the capacitance 348 which may induce a change in voltage level on the sense node 340, for example, to boost the sense node 340 to a higher voltage level, such as through capacitive coupling.

Additional transistors of the sense circuit facilitate sensing of a voltage level on the sense node 340. For example, the control gate of a sense transistor (e.g., p-type field effect transistor, or pFET) 350 is shown connected to the sense node 340. Thus, transistor 350 is configured to be responsive to a voltage level present on the sense node 340. Signal line 356 connected to the gate of a sense enable transistor (e.g., pFET) 358 and configured to receive control signal senb facilitates isolating the transistor 350 from the voltage node 360, which may be configured to receive a supply voltage, e.g., Vcc. The sense circuit output (e.g., sa_out) line 362 might be connected to additional circuitry (not shown in FIG. 3) of the memory device configured to respond to the sense circuit 300 as part of a sensing operation. For example, the sense circuit 300 may be a component of the data register 120 of FIG. 1 and its output sa_out may be provided as an input to the cache register 118 for output of the sensed data state from the memory device 100. The output signal sa_out on output line 362 might comprise a signal generated by a latch (e.g., latch circuit) 364 which is representative of a logic level, such as a logic 'high' (e.g., represented by Vcc) or logic 'low' (e.g., represented by Vss) level indicative of a sensed data state of a selected memory cell of NAND string 206, for example. Latch 364 may comprise a pair of cross-coupled inverters, for example. For some embodiments, latch 364 might be eliminated, connecting the output line 362 to the transistor 350.

During a precharge portion of a sense operation, the gate of transistor 344 is biased by a voltage level (e.g., of control signal blpre) on signal line 342 to precharge the sense node 340 by injecting a precharge current into the sense node 340. An additional voltage level (e.g., of control signal blclamp) may be applied to signal line 366 to activate transistor (e.g., nFET) 368, and a further voltage level (e.g., of control signal tc_iso) may be applied to signal line 370 to activate transistor (e.g., nFET) 352. Activating transistors 344, 352 and 368 serves to connect data line 204 to the voltage node 346, thereby precharging the sense node 340 and the data line 204.

Following the precharging of the sense node 340 and the data line 204, a second portion of the sense operation is performed to detect whether or not the precharged data line 204 and sense node 340 is discharged during the sense operation, thereby determining the data state of the memory cell selected for sensing. In general, following the precharging of the sense node 340 and the data line 204, the sense node 340 may be isolated from the data line 204, such as by deactivating the transistor 368 and/or deactivating the transistor 352. The data line 204 is then selectively connected to the source 216 depending upon whether the memory cell selected for sensing is activated or deactivated in response to a sense voltage applied to its control gate. After the data line 204 is given an opportunity to discharge if current is flowing through the NAND string 206, the sense node 340 may again be connected to the data line 204 by activating the transistors 352 and 368. If a voltage level of the data line 204 is lower than the precharge voltage level due to current flow through the NAND string 206, the voltage level of the sense node 340 will likewise experience a drop. If the voltage level of the data line 204 remains at the precharge voltage level, such as when the memory cell selected for sensing remains deactivated, the voltage level of the sense node 340 may remain at its precharge (or boosted) voltage level. With the transistor 358 activated, and the voltage level of the sense node 340 applied to the control gate of the transistor 350, the voltage node 360 may be selectively connected to the latch 364 depending upon a voltage level of the sense node 340. The latch 364 may have a particular logic level (e.g., logic high) prior to sensing. If the voltage level of the voltage node 360 is applied to the input of the latch 364 upon activation of the transistor 358, its logic level may change, e.g., from a logic high level to a logic low level, and if the voltage node 360 remains isolated from the input of the latch 364 upon activation of the transistor 358, its logic level may remain at the particular logic level.

Various embodiments may utilize boosting and deboosting of the sense node 340 during the sense operation. Boosting (e.g., capacitively coupling a boost voltage level to) and deboosting (e.g., capacitively decoupling a deboost voltage level from) the sense node 340 might be used, for example, to facilitate a higher develop overhead. By boosting the sense node 340 prior to the sense node develop time, the voltage level of the sense node 340 can be allowed to develop longer without prematurely indicating current flow of the data line 204. Subsequent deboosting of the sense node 340 after isolation from the NAND string 206 from the data line 204 permits the voltage level of the sense node 340 to drop below the trip point (e.g., threshold voltage) of the transistor 350 to indicate that current flow was detected.

The trip point of the sense circuit 300 may generally be dependent upon the threshold voltage of the transistor 350. The sense circuit 300 is typically configured to have a trip point (e.g., sense threshold level) close to the precharge voltage level that may be established on the sense node 340 prior to sensing the selected memory cell. The trip point might be a particular voltage level on the sense node 340 wherein the sense circuit 300 outputs a first logic level indicative of a first data state of a sensed selected memory cell when the voltage level of the sense node 340 is equal to or above the trip point. The sense circuit 300 might output a second logic level indicative of a second data state of the sensed selected memory cell when the voltage level of the sense node 340 is below the trip point, for example.

Figure 4A:
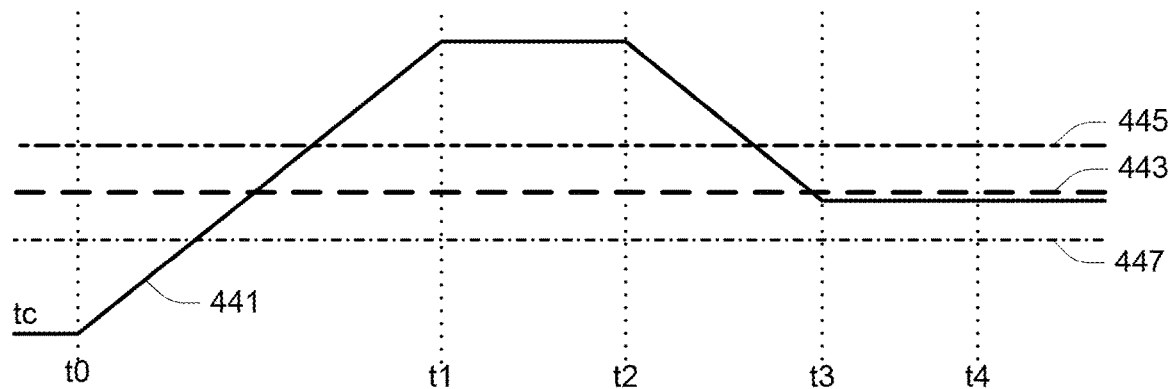
FIGS. 4A-4C are timing diagrams generally depicting a voltage level of a sense node of a sense circuit such as depicted in FIG. 3 at various stages of a sense operation in accordance with embodiments.
Figure 4B:
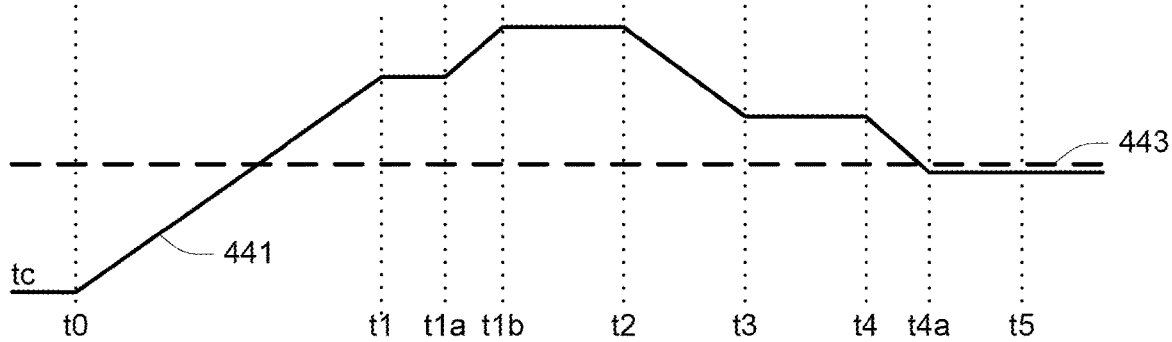
Figure 4C:
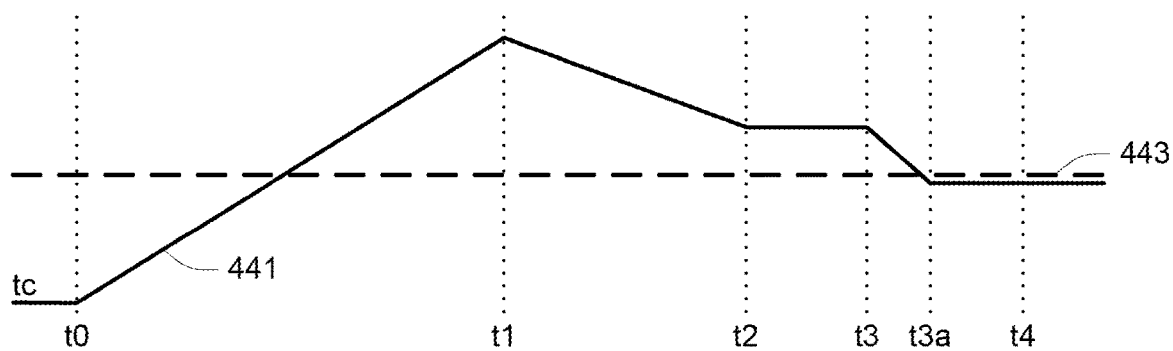

FIGS. 4A-4C are timing diagrams generally depicting waveform 441 representing a voltage level of a sense node 340 of a sense circuit 300 such as depicted in FIG. 3 at various stages of different types of sense operations. With regard to FIG. 4A, a precharge portion of the sense operation may begin at time t0 by biasing control signals blpre, blclamp and tc_iso to voltage levels sufficient to activate transistors 344, 368 and 352, respectively, thereby connecting the sense node 340 to the voltage node 346 and the data line 204. In response, the waveform 441 increases. At time t1, the sense node 340 may be isolated from the data line 204 and the voltage node 346 to end the precharge portion, such as by deactivation of the transistors 344 and 368. Between time t1 and time t2, the data line 204 is selectively connected to the source 216 depending upon whether the memory cell selected for sensing is activated or not in response to the sense voltage, and is allowed to discharge if connected. At time t2, the sense node 340 is again connected to the data line 204 and, where the data line 204 has discharged, the waveform 441 will decrease such as depicted in the example of FIG. 4A. The time period between time t2 and t3 of FIG. 4A, i.e., when the sense node 340 is allowed to seek to equilibrate with the data line 204 after it has been connected to the memory cell selected for sensing, may be referred to as the sense node develop time. At time t4, the transistor 350 is connected to the voltage node 360, thereby generating the output signal sa_out to have a logic level (e.g., voltage level)

indicative of whether the waveform 441 has fallen below the trip point 443, and thus indicative of the data state of the memory cell being sensed.

FIG. 4B may utilize a similar sense operation as described with reference to FIG. 4A with the inclusion of boosting and deboosting of the voltage level of the sense node 340. In particular, with regard to FIG. 4B, a precharge portion of the sense operation may begin at time t0 by biasing control signals blpre, blclamp and tc_iso to voltage levels sufficient to activate transistors 344, 368 and 352, respectively, thereby connecting the sense node 340 to the voltage node 346 and the data line 204. In response, the waveform 441 increases. At time t1, the sense node 340 may be isolated from the data line 204 and the voltage node 346 to end the precharge portion, such as by deactivation of the transistors 344 and 368. At time t1a, the sense node 340 is boosted by some particular voltage level above the precharge voltage level, such as by applying a boost voltage 551 (e.g., boost voltage level) to the voltage node 354, reaching a boosted voltage level at time t1b. Between time t1 and time t2, the data line 204 is selectively connected to the source 216 depending upon whether the memory cell selected for sensing is activated or not in response to the sense voltage, and is allowed to discharge if connected. At time t2, the sense node 340 is again connected to the data line 204 and, where the data line 204 has discharged, the waveform 441 will decrease such as depicted in the example of FIG. 4B. The time period between time t2 and t3 of FIG. 4B, i.e., when the sense node 340 is allowed to seek to equilibrate with the data line 204 after it has been connected to the memory cell selected for sensing, may be referred to as the sense node develop time. At time t4, after the sense node 340 has been connected to, and subsequently isolated from, the data line 204, the sense node 340 is deboosted by the particular voltage level, reaching a deboosted voltage level at time t4a. At time t5, the transistor 350 is connected to the voltage node 360, thereby generating the output signal sa_out to have a logic level (e.g., voltage level) indicative of whether the waveform 441 has fallen below the trip point 443, and thus indicative of the data state of the memory cell being sensed.

FIG. 4C may utilize a similar sense operation as described with reference to FIG. 4B without isolation of the sense node 340 until after the sense node develop time, and without an isolated boosting, such as at time t1a of FIG. 4B. In particular, with regard to FIG. 4C, a precharge portion of the sense operation may begin at time t0 by biasing control signals blpre, blclamp and tc_iso to voltage levels sufficient to activate transistors 344, 368 and 352, respectively, thereby connecting the sense node 340 to the voltage node 346 and the data line 204. In response, the waveform 441 increases. A boost voltage of some particular voltage level may be applied to the voltage node 354 during this time. At time t1, the sense node 340 may be isolated from the voltage node 346 to end the precharge portion, such as by deactivation of the transistor 344. The data line 204 is selectively connected to the source 216 depending upon whether the memory cell selected for sensing is activated or not in response to the sense voltage, and is allowed to discharge if connected. Where the data line 204 is discharging, the waveform 441 will decrease such as depicted in the example of FIG. 4C. The time period between time t1 and t2 of FIG. 4C, i.e., when the sense node 340 is allowed to seek to equilibrate with the data line 204 is connected to the memory cell selected for sensing, may be referred to as the sense node develop time. Note that the sense node develop time of each of the embodiments of FIGS. 4A-4C involves connection of the sense node 340 to the data line 204, and isolation of the sense node 340 from the voltage node 346. At time t3, after the sense node 340 has been isolated from the data line 204, the sense node 340 is deboosted by the particular voltage level, reaching a deboosted voltage level at time t3a. At time t4, the transistor 350 is connected to the voltage node 360, thereby generating the output signal sa_out to have a logic level (e.g., voltage level) indicative of whether the waveform 441 has fallen below the trip point 443, and thus indicative of the data state of the memory cell being sensed.

Trip point 443 of the transistor 350 might represent a trip point at some nominal temperature, such as a desired operating temperature of the sense circuit 300. However, as temperatures vary from this nominal temperature, the trip point (e.g., threshold voltage) of the transistor 350 may change. For example, as depicted in FIG. 4A, at temperatures higher than the nominal temperature, the trip point of the transistor 350 may be represented as trip point 445 (e.g., some threshold voltage level higher than trip point 443), while at temperatures lower than the nominal temperature, the trip point of the transistor 350 may be represented as trip point 447 (e.g., some threshold voltage level lower than trip point 443). In the example of FIG. 4A, it can be seen that if the trip point of the transistor 350 is represented by trip point 447, an erroneous indication of the data state of the memory cell would result. Similarly, if the precharge voltage level is chosen to be close to the nominal trip point 443, a rise of the trip point of the transistor 350 to trip point 445 may result in an indication of current flow where none has occurred when the precharge voltage level is less than trip point 445. These concepts also apply to the examples of FIGS. 4B and 4C.

FIG. 5A is a timing diagram generally depicting a voltage level of various nodes of a sense circuit such as depicted in FIG. 3 at various stages of a sense operation, providing additional detail to a sense operation such as described with reference to FIG. 4B. With regard to FIG. 5A, a precharge portion of the sense operation may begin at time t0 by biasing control signals blpre, blclamp and tc_iso to voltage levels sufficient to activate transistors 344, 368 and 352, respectively, thereby connecting the data line 204 and the sense node 340 to the voltage node 346. In response the voltage level tc of the sense node 340 and the voltage level data line of the data line 204 increase. At time t1, the sense node 340 may be isolated from the data line 204 and the voltage node 346, such as by biasing control signals blpre and blclamp to voltage levels sufficient to deactivate the transistors 344 and 368. Note that the control signal tc_iso may remain at the level sufficient to activate the transistor 352 as transistor 368 provides isolation from the data line 204.

Between time t1 and time t2, the data line 204 is selectively connected to the source 216 depending upon whether the memory cell selected for sensing is activated or not in response to the sense voltage. If the memory cell is activated, the data line 204 may decrease in voltage as current flows through the NAND string 206, such as depicted in dashed line, and if the memory cell is deactivated, the data line 204 may remain at the precharge voltage level, such as depicted in solid line. At time t1a, the boost voltage is applied at voltage node 354, thereby boosting the voltage level of the sense node 340 to a boosted voltage level (e.g., higher than the precharge voltage level) at time t1b. At time t2, the sense node 340 is again connected to the data line 204, such as by biasing control signal blpre to a voltage level sufficient to activate the transistor 368, and, where the data line 204 has discharged, the voltage level of the sense node 340 will decrease such as depicted in dashed line tc. At time t3, the sense node 340 is isolated from the data line 204, such as by biasing control signals blclamp and/or tc_iso to voltage levels sufficient to deactivate one or both transistors 352 and 368. At time t4, after the sense node 340 has been connected to, and subsequently isolated from, the data line 204, the sense node 340 is deboosted by some particular voltage level, such as by removing a deboost voltage 553 (e.g., deboost voltage level) from the voltage node 354, thereby reaching a deboosted voltage level at time t4a. At time t5, the transistor 350 is connected to the voltage node 360 by biasing the control signal senb to a voltage level sufficient to activate the transistor 358. If the transistor 350 is activated, the voltage node 360 is connected to the latch 364, thereby changing the logic level of the output signal sa_out, and if the transistor 350 is deactivated, the voltage node 360 remains isolated form the latch 364, allowing the logic level of the output signal sa_out to remain unchanged. While this example describes a change in logic level of the output signal sa_out (e.g., a change in the logic level of the latch 364) from a logic high level to a logic low level as indicating the voltage level of the sense node 340 being below the trip point of the transistor 350, a transition from a logic low level to a logic high level could alternatively be provided with appropriate changes in the latch 364, e.g., by providing an additional inverter to the output of the latch.

FIG. 5B is a timing diagram generally depicting a voltage level of various nodes of a sense circuit such as depicted in FIG. 3 at various stages of a sense operation, providing additional detail to a sense operation such as described with reference to FIG. 4C. With regard to FIG. 5B, a precharge portion of the sense operation may begin at time t0 by biasing control signals blpre, blclamp and tc_iso to voltage levels sufficient to activate transistors 344, 368 and 352, respectively, thereby connecting the data line 204 and the sense node 340 to the voltage node 346. In response the voltage level tc of the sense node 340 and the voltage level data line of the data line 204 increase. The boost voltage 551 (e.g., boost voltage level) may be applied at voltage node 354 during this time, reaching a level 551 at time t0a. At time t1, the sense node 340 may be isolated from the voltage node 346, such as by biasing control signal blpre to a voltage level sufficient to deactivate the transistor 344.

Between time t1 and time t2, the data line 204 is selectively connected to the source 216 depending upon whether the memory cell selected for sensing is activated or not in response to the sense voltage. If the memory cell is activated, the data line 204 may decrease in voltage as current flows through the NAND string 206, such as depicted in dashed line, and if the memory cell is deactivated, the data line 204 may remain at the precharge voltage level, such as depicted in solid line. In response, the voltage level of the sense node 340 will decrease such as depicted in dashed line tc. At time t3, after the sense node 340 has been isolated from the data line 204, the sense node 340 is deboosted by some particular voltage level, such as by removing a deboost voltage 553 (e.g., deboost voltage level) from the voltage node 354, thereby reaching a deboosted voltage level at time t3a. At time t4, the transistor 350 is connected to the voltage node 360 by biasing the control signal senb to a voltage level sufficient to activate the transistor 358. If the transistor 350 is activated, the voltage node 360 is connected to the latch 364, thereby changing the logic level of the output signal sa_out, and if the transistor 350 is deactivated, the voltage node 360 remains isolated form the latch 364, allowing the logic level of the output signal sa_out to remain unchanged. While this example describes a change in logic level of the output signal sa_out (e.g., a change in the logic level of the latch 364) from a logic high level to a logic low level as indicating the voltage level of the sense node 340 being below the trip point of the transistor 350, a transition from a logic low level to a logic high level could alternatively be provided with appropriate changes in the latch 364, e.g., by providing an additional inverter to the output of the latch.

Figure 5C:
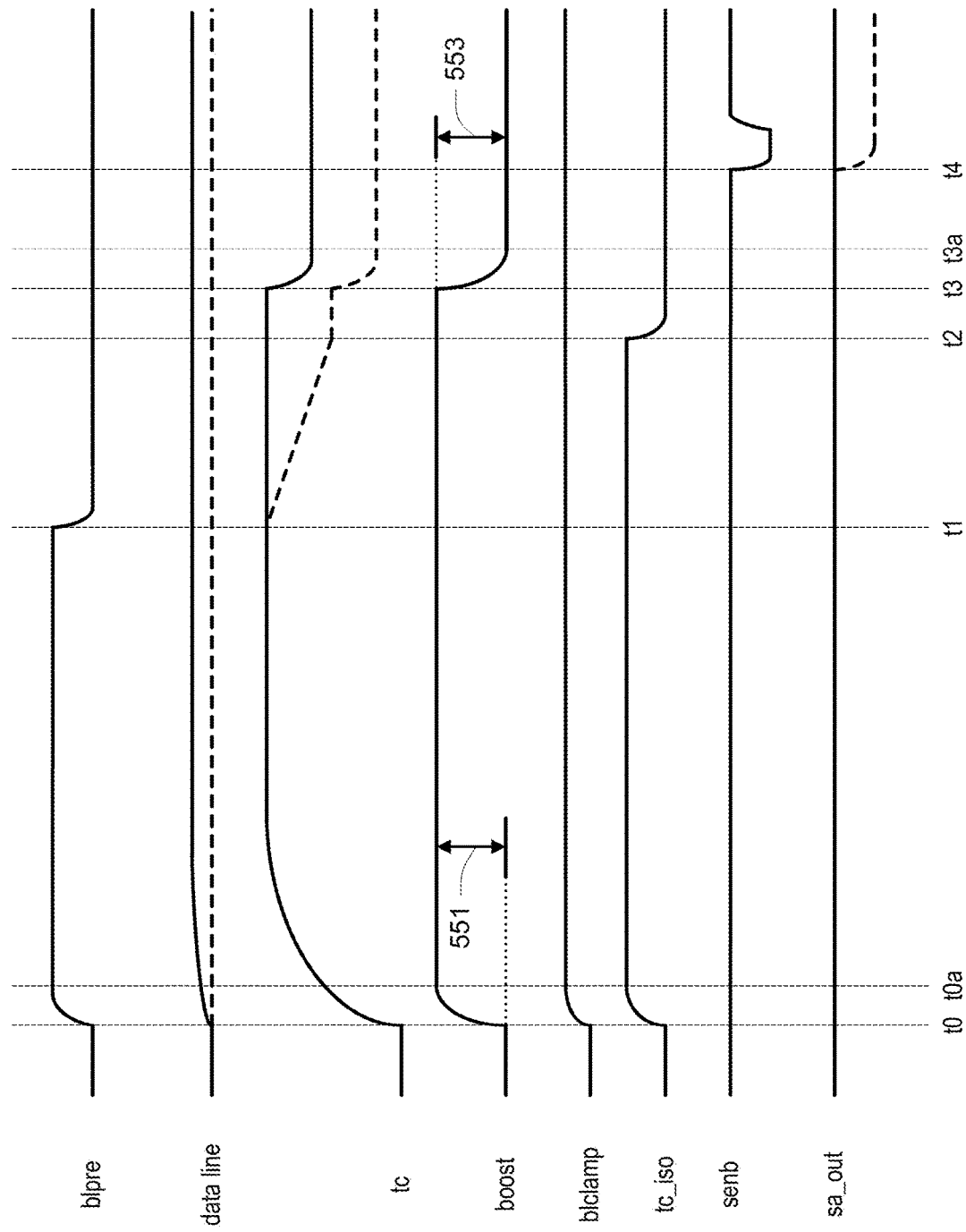

FIG. 5C is a timing diagram generally depicting a voltage level of various nodes of a sense circuit such as depicted in FIG. 3 at various stages of a sense operation, providing additional detail to another sense operation such as described with reference to FIG. 4C, except that isolation of the sense node might occur in response to cut-off of the transistor 368 during a precharge portion. With regard to FIG. 5C, a precharge portion of the sense operation may begin at time t0 by biasing control signals blpre, blclamp and tc_iso to voltage levels sufficient to activate transistors 344, 368 and 352, respectively, thereby connecting the data line 204 and the sense node 340 to the voltage node 346. In response the voltage level tc of the sense node 340 and the voltage level data line of the data line 204 increase. A voltage level of the control signal blclamp might be chosen to provide a current level of the transistor 368 similar to that of the NAND string 206. In this manner, if the memory cell selected for sensing is activated, the voltage level of the data line might remain near the reference voltage, as shown in dashed line. Conversely, if the memory cell selected for sensing is deactivated, the voltage level of the data line might rise to a level near blclamp minus the threshold voltage of the transistor 368 as shown in solid line, such that $V_{GS}$ of the transistor 368 may be insufficient to maintain activation (e.g., cut-off). The boost voltage 551 (e.g., boost voltage level) may be applied at voltage node 354 during this time, reaching a level 551 at time t0a. At time t1, the sense node 340 may be isolated from the voltage node 346, such as by biasing control signal blpre to a voltage level sufficient to deactivate the transistor 344, and thus be allowed to seek to equilibrate with the data line.

With the sense node 340 isolated from the voltage node 346, the voltage level of the sense node 340 may decrease, such as depicted in dashed line tc, if the selected memory cell is activated, and may tend to remain at the precharge level, such as depicted in solid line tc, if the selected memory cell is deactivated. At time t3, after the sense node 340 has been isolated from the data line 204, the sense node 340 is deboosted by some particular voltage level, such as by removing a deboost voltage 553 (e.g., deboost voltage level) from the voltage node 354, thereby reaching a deboosted voltage level at time t3a. At time t4, the transistor 350 is connected to the voltage node 360 by biasing the control signal senb to a voltage level sufficient to activate the transistor 358. If the transistor 350 is activated, the voltage node 360 is connected to the latch 364, thereby changing the logic level of the output signal sa_out, and if the transistor 350 is deactivated, the voltage node 360 remains isolated form the latch 364, allowing the logic level of the output signal sa_out to remain unchanged. While this example describes a change in logic level of the output signal sa_out (e.g., a change in the logic level of the latch 364) from a logic high level to a logic low level as indicating the voltage level of the sense node 340 being below the trip point of the transistor 350, a transition from a logic low level to a logic high level could alternatively be provided with appropriate changes in the latch 364, e.g., by providing an additional inverter to the output of the latch.

Figure 6A:
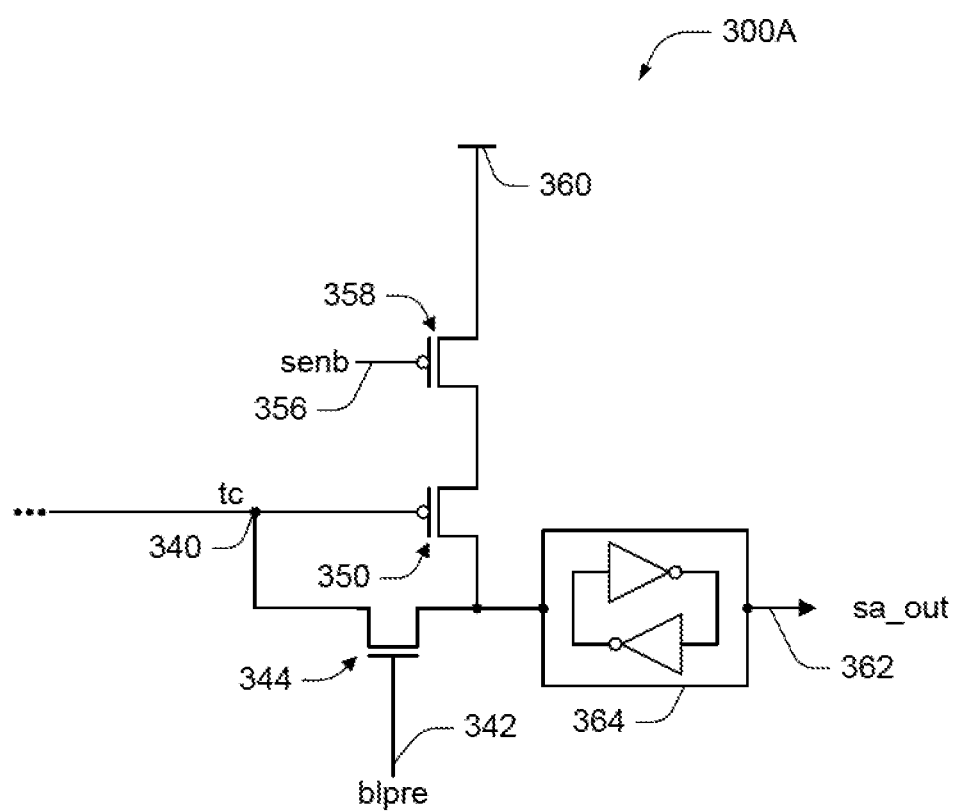
FIGS. 6A and 6B are schematics of portions of a sense circuit in accordance with embodiments.
Figure 6B:
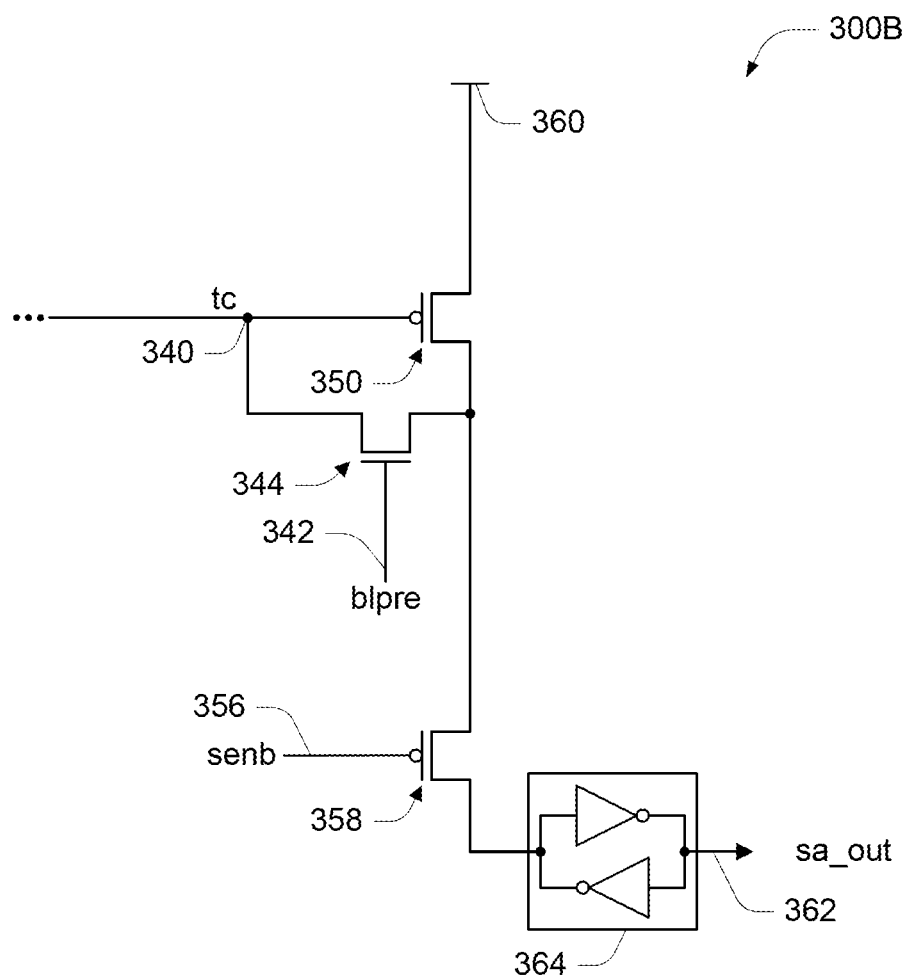

To compensate for temperature variations, changes in the precharge path can be incorporated into the sense circuit, e.g., to provide current flow through the sense transistor 350. FIGS. 6A and 6B are schematics of portions of a sense circuit in accordance with such embodiments. In FIG. 6A, the sense enable transistor (e.g., pFET) 358 has a first source/drain connected to the voltage node 360 and a control gate connected to receive the control signal senb on signal line 356. The sense transistor (e.g., pFET) 350 has a first source/drain connected to a second source/drain of the transistor 358, a second source/drain connected to an input of an optional latch 364, and a control gate connected to the sense node 340. The precharge transistor 344 has a first source/drain connected to the sense node 340, a second source/drain connected to the second source/drain of the transistor 350 (and to the input of the latch 364), and a control gate connected to receive the control signal blpre on signal line 342. In this configuration, during the precharge portion of the sense operation, the sense node 340 can be precharged to a voltage level sufficient to deactivate the transistor 350. For example, current may flow from the voltage node 360 through the transistor 344 (and through the transistors 350 and 358) to the sense node 340 until a voltage level of the sense node 340 reaches a level sufficient to deactivate the transistor 350. During this period, the control signal senb would have a voltage level sufficient to activate the transistor 358. Such a configuration facilitates precharging the sense node 340 (and the data line 204) to a voltage level near (e.g., at) the trip point of the transistor 350, regardless of the operating temperature.

In FIG. 6B, the sense transistor (e.g., pFET) 350 has a first source/drain connected to the voltage node 360 and a control gate connected to the sense node 340. The sense enable transistor (e.g., pFET) 358 has a first source/drain connected to a second source/drain of the transistor 350, a second source/drain connected to an input of an optional latch 364, and a control gate connected to receive the control signal senb on signal line 356. The precharge transistor 344 has a first source/drain connected to the sense node 340, a second source/drain connected to the second source/drain of the transistor 350 (and to the first source/drain of the transistor 358), and a control gate connected to receive the control signal blpre on signal line 342. In this configuration, during the precharge portion of the sense operation, the sense node 340 can be precharged to a voltage level sufficient to deactivate the transistor 350. For example, current may flow from the voltage node 360 through the transistor 344 (and through the transistor 350) to the sense node 340 until a voltage level of the sense node 340 reaches a level sufficient to deactivate the transistor 350. During this period, the control signal senb may have a voltage level sufficient to deactivate the transistor 358. Such a configuration facilitates precharging the sense node 340 (and the data line 204) to a voltage level near (e.g., at) the trip point of the transistor 350, regardless of the operating temperature.

In addition to, or as an alternative to, configuring the precharge path to include the sense transistor as described with reference to FIGS. 6A and 6B, changes in the operation of the memory can also facilitate compensation for temperature variations. For example, to compensate for a higher than nominal trip point, e.g., due to a higher than nominal operating temperature, the sense node develop time, e.g., the time period from time t2 to time t3 of FIGS. 4A, 4B and 5A, or the time period from time t1 to time t2 of FIGS. 4C, 5B and 5C, can be shortened from some nominal value. Similarly, to compensate for a lower than nominal trip point, e.g., due to a lower than nominal operating temperature, the sense node develop time can be lengthened from the nominal value. In general, the sense node develop time can be determined as a function (e.g., a decreasing function) of the sensed temperature (e.g., of the indication of the sensed temperature).

To compensate for a higher than nominal trip point, e.g., due to a higher than nominal operating temperature, the ratio of the deboost voltage 553 (e.g., the voltage level removed from the boosted voltage) to the boost voltage 551 (e.g., the voltage level coupled to the sense node from voltage node 354 prior to the sense node develop time), can be reduced from some nominal value. For example, where some voltage level is applied to the voltage node 354 during a boost portion of a sense operation (e.g., time period from time t1a to time t3a of FIGS. 4B and 5), some value less than that voltage level may be removed from the voltage node 354 (e.g., at time t3a). As an example, where a voltage level of the voltage node 354 is increased from a first voltage level (e.g., at time t1a of FIG. 5A or at time t0 of FIGS. 5B and 5C) to a second voltage level (e.g., at time t1b of FIG. 5A or at time t0a of FIGS. 5B and 5C), the voltage node 354 may be decreased to a third voltage level (e.g., at time t4a of FIG. 5A or at time t3a of FIGS. 5B and 5C) that is less than the second voltage level, and may be greater than the first voltage level. The difference between the second voltage level and the first voltage level (e.g., an absolute value of the difference) can be thought of as the boost voltage 551, and the difference between the second voltage level and the third voltage level (e.g., an absolute value of the difference) can be thought of as the deboost voltage 553. Similarly, to compensate for a lower than nominal trip point, e.g., due to a lower than nominal operating temperature, the ratio of the deboost voltage to the boost voltage can be increased from the nominal value. As an example, where a voltage level of the voltage node 354 is increased from a first voltage level (e.g., at time t1a of FIG. 5A or at time t0 of FIGS. 5B and 5C) to a second voltage level (e.g., at time t1b of FIG. 5A or time t0a of FIGS. 5B and 5C), the voltage node 354 may be decreased to a third voltage level (e.g., at time t4a of FIG. 5A or at time t3a of FIGS. 5B and 5C) that is less than the second voltage level, and may be less than the first voltage level. In general, the ratio of the deboost voltage to the boost voltage can be determined as a function (e.g., a decreasing function) of the sensed temperature. It is noted that using a fixed boost voltage and varying the deboost voltage can produce similar (e.g., the same) results as using a fixed deboost voltage and varying the boost voltage. Similarly, both the boost voltage and the deboost voltage might be varied to produce similar (e.g., the same) results.

To compensate for a higher than nominal trip point, e.g., due to a higher than nominal operating temperature, the precharge voltage level (e.g., the voltage level developed at the sense node 340 during the precharge portion) can be reduced from some nominal value. As an example, the voltage level of the control signal blpre can be reduced, thereby causing the transistor 344 to cut off (e.g., become deactivated) at a lower voltage level on sense node 340 as the gate to source voltage of the transistor 344 will reach its threshold voltage at a lower precharge voltage level, or the voltage level applied to the voltage node 346 may be reduced. Similarly, to compensate for a lower than nominal trip point, e.g., due to a lower than nominal operating temperature, the precharge voltage level can be increased from the nominal value. In general, the precharge voltage level (or the voltage level of the control signal blpre) can be determined as a function (e.g., a decreasing function) of the sensed temperature.

Figure 7:
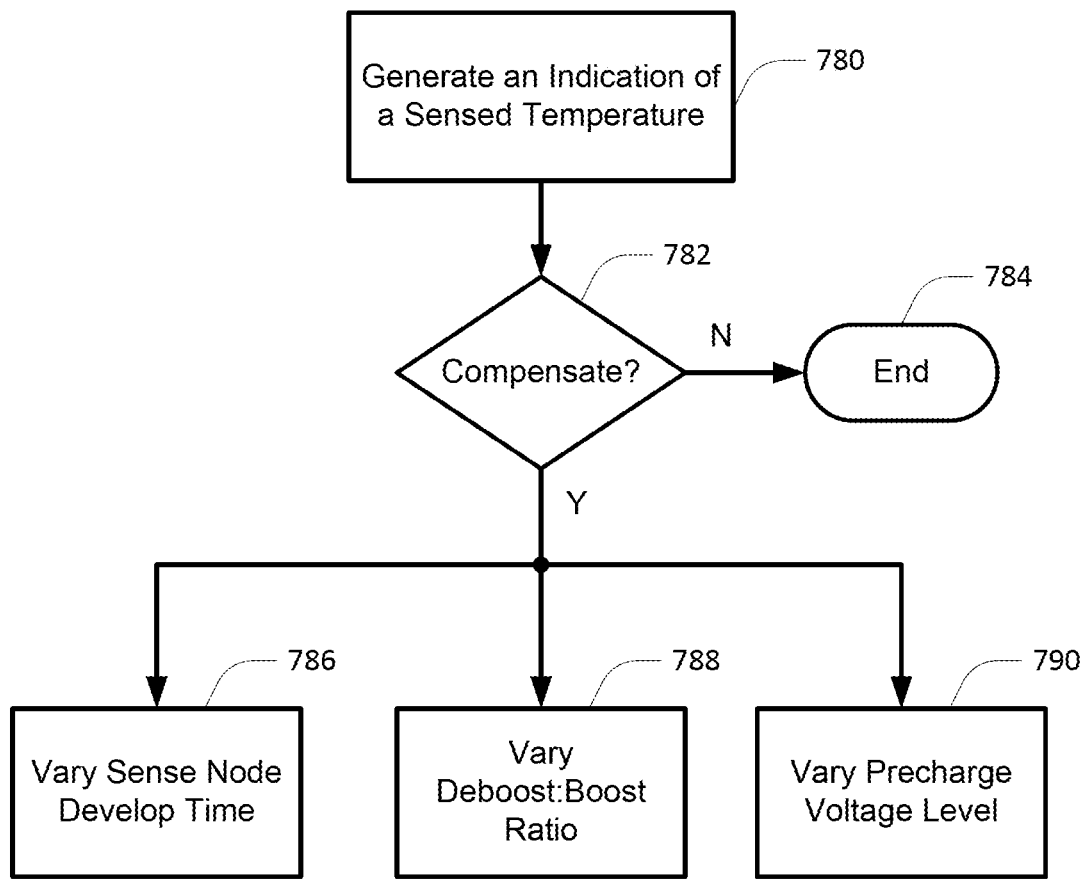
FIG. 7 is a flowchart of a portion of a method of operating a memory according to an embodiment.

FIG. 7 is a flowchart of a portion of a method of operating a memory according to an embodiment. At 780, a temperature is sensed to generate an indication of the sensed temperature. The indication is generally representative of the temperature being sensed and may be, for example, a voltage level indicative of the sensed temperature, a resistance level indicative of the sensed temperature, a digital value indicative of the sensed temperature, etc. The temperature may be sensed by a temperature sensor internal to the memory device containing the sense circuit. Alternatively, the temperature may be sensed by a temperature sensor external to the memory device. If an external temperature sensor is utilized, it may be beneficial to position the temperature sensor near the memory device such that the sensed ambient temperature might be expected to be representative of the operating temperature of the memory device, and of the sense circuit. For example, the external temperature sensor may be a component of a circuit board containing the memory device, a circuit module containing the memory device, a solid state drive (SSD) containing the memory device, etc.

At 782, a decision might be made whether any temperature compensation is desired. If compensation is not desired, the method may end at 784. For example, a memory device might be rated for operation from 0° C. to 70° C., which might be used as the relevant range of temperatures. It may be determined that the sense operation performs adequately without temperature compensation from 15° C. to 35° C., but that compensation is desired at temperatures below 15° C. or above 35° C. If the sensed temperature indicates a temperature at or between 15° C. and 35° C., no compensation is desired and the method proceeds to 784. However, if the temperature is below 15° C. or above 35° C., the method might proceed for these subsets of the relevant range of temperatures. For some embodiments, the decision at 782 may be eliminated, thereby proceeding with compensation for any temperature within a relevant range of temperatures. For further embodiments, compensation may proceed for any sensed temperature.

At 786, the attribute of the sense node develop time is varied in response to the indication of the sensed temperature as a decreasing function of temperature. At 788, the attribute of the deboost voltage to boost voltage ratio is varied in response to the indication of the sensed temperature as a decreasing function of temperature. At 790, the attribute of the precharge voltage level is varied in response to the indication of the sensed temperature as a decreasing function of temperature. Although all three of these compensation schemes are depicted in FIG. 7, they may be used individually or in any combination.

Various embodiments have described varying a time (e.g., sense node develop time), a ratio (e.g., ratio of deboost voltage level to boost voltage level) or a voltage (e.g., precharge voltage level or control signal voltage level) as a function of temperature (e.g., ambient temperature or device operating temperature). In general these attributes may vary as a decreasing function of temperature. For various decreasing functions of temperature, a value of the attribute for some particular temperature is less than or equal to the value of the attribute at each lesser relevant temperature, and may be less than the value of the attribute for at least a subset of lesser relevant temperatures. The value of the attribute for the particular temperature may further be greater than or equal to the value of the attribute at each greater relevant temperature, and may be greater than the value of the attribute for at least a subset of greater relevant temperatures. For some embodiments, each value of the attribute for any relevant temperature is less than or equal to the value of the attribute at each lesser relevant temperature, and less than the value of the attribute for at least a subset of lesser relevant temperatures.

As used herein, the range of relevant temperatures is an expected or defined range of temperatures for operation of the device. For example, the decreasing functions may be defined within a range of temperatures the device is expected to experience during operation, a range of temperatures for which the device is rated to operate (e.g., as defined by a manufacturer of the device), or a range of temperatures for which temperature compensation is desired, which may include any sensed temperature. For some embodiments, temperature compensation outside of the range of relevant temperatures may be performed using a value of an attribute at one end of the range of relevant temperatures or the other, depending upon whether the sensed temperature is indicated to be below or above the range of relevant temperatures. For example, where a sense node develop time varies from a first value at a minimum temperature of the range of relevant temperatures to a second, lower, value at a maximum temperature of the range of relevant temperatures, the first value of the sense node develop time might be used for any temperature below the minimum temperature of the range of relevant temperatures and the second value of the sense node develop time might be used for any temperature above the maximum temperature of the range of relevant temperatures. For other embodiments, the decreasing function may define an attribute value for any sensed temperature.

Figure 8:
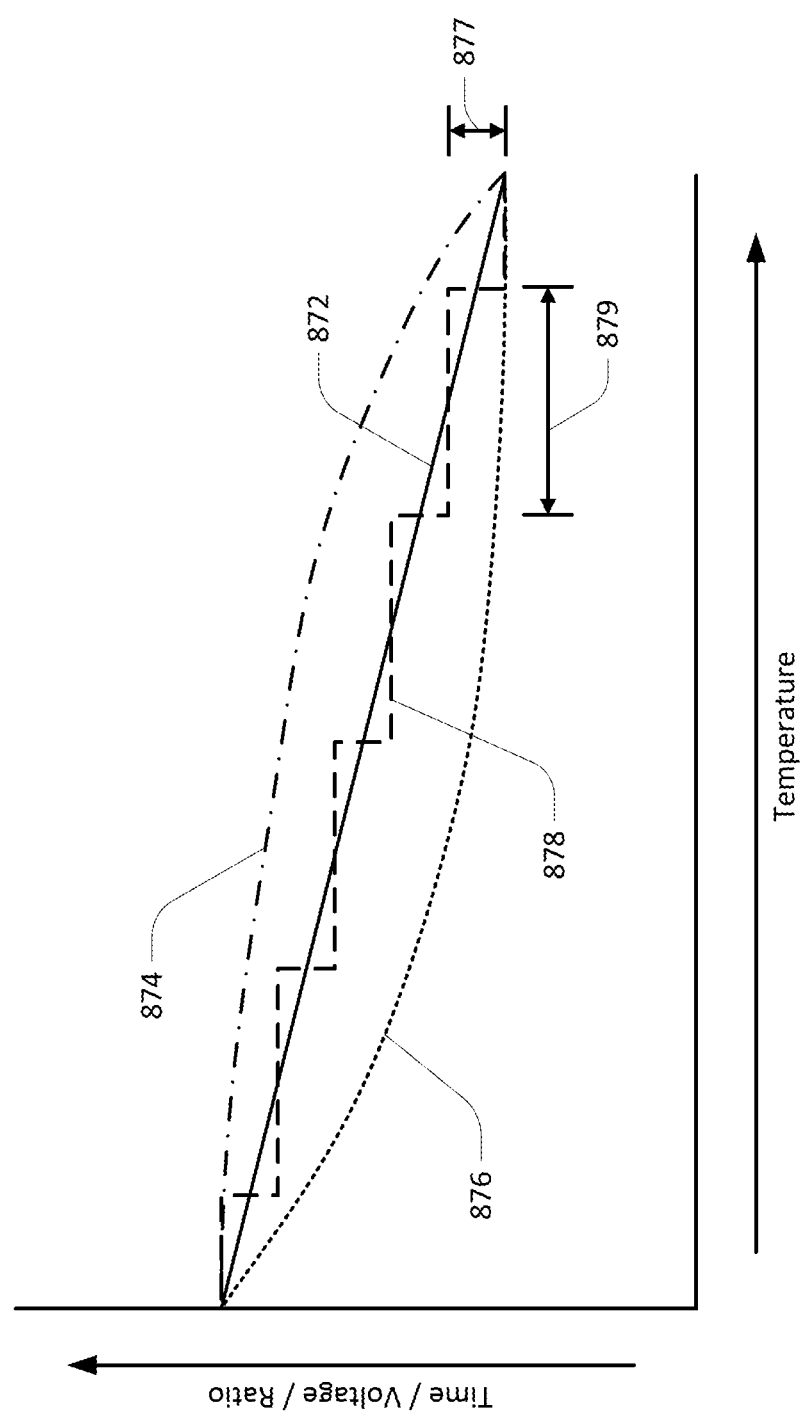
FIG. 8 depicts various decreasing functions for use with embodiments.

Examples of some types of decreasing functions of temperature are generally depicted in FIG. 8. Line 872 represents a linear decreasing function, e.g., having a constant negative slope. Line 874 represents a decreasing function of decreasing slope. For example, the function of line 874 may have a slope near zero at the lower range of temperature, and the slope of line 874 may decrease (e.g., become more negative) as the temperature is increased. Line 876 represents a decreasing function of increasing slope. For example, the function of line 876 may have a negative slope at the lower range of temperature, and the slope of line 876 may increase (e.g., become less negative) as the temperature is increased. Line 878 represents a stepped decreasing function having successively lower steps as the temperature is increased. Note that while steps of line 878 are depicted to have equal height 877 and equal length 879, these values could be varied. For example, a particular step may have a greater height 877 and lesser length 879 than a preceding step, or it may have a lesser height 877 and greater length 879 than a preceding step. Stepped functions may represent the use of a look-up table, where the value of the attribute is determined by looking up the value of the temperature in the table and selecting the value of the attribute corresponding to that temperature. Table 1 is a conceptual example of a look-up table. Alternatively, the value of the attribute for a decreasing function may be directly calculated from an equation of the decreasing function, e.g., $Y=f(T)$.

TABLE 1

Attribute Values (Y) as Function of Sensed Temperature (T)

| Sensed Temperature (T) | Attribute Value (Y) |
|---|---|
| $T1 <= T < T2$ | Y1 |
| $T2 <= T < T3$ | Y2 |

TABLE 1-continued

Attribute Values (Y) as Function of Sensed Temperature (T)

| Sensed Temperature (T) | Attribute Value (Y) |
|---|---|
| T3 <= T < T4 | Y3 |
| T4 <= T <= T5 | Y4 |

While several examples of decreasing functions are described with reference to FIG. 8, other decreasing functions can be used where a value of the attribute at some relevant temperature is less than or equal to the value of the attribute at each lesser relevant temperature, and less than the value of the attribute for at least a subset of lesser relevant temperatures. Decreasing functions described herein might, for example, be determined experimentally, empirically or through simulation.

Note that the decreasing functions may define attribute values for which the memory device is not configured to attain. This may be the result of physical constraints, e.g., a negative develop time or a voltage level that is harmful to the memory device. For such constraints, the memory device (e.g., controller of the memory device) might be configured to limit variations of attributes of the sense operation to values to a range within its ability to attain and/or to a range within the ability of the attribute to produce the desired response, e.g., to provide an expected benefit to the sense operation.

Constraints may further include configuration constraints, e.g., the memory device (e.g., controller of the memory device) might be configured to generate some limited number of different values for the attribute. For example, process variation among integrated circuit devices is to be expected, and memory device manufacturers often provide an ability at the time of fabrication to select values of such attributes as read voltages, program voltages, erase voltages, etc. to provide the expected performance of the memory device despite this process variation. This is often enabled by the use of trim registers, where different values of a trim register correspond to different values of an attribute. After testing of the memory device, these trim registers are set to select the desired attribute value for operation of the memory device. Typically, these trim registers contain one or more digits of storage (e.g., fuses, anti-fuses, memory cells, etc.), and each digital value of a trim register corresponds to a particular respective attribute value. A one-digit trim register can represent one of two attribute values, a two-digit trim register can represent one of up to four attribute values, a three-digit trim register can represent one of up to eight attribute values, etc.

Where a reprogrammable trim register (e.g., using memory cells) is used, the controller (e.g., the internal controller) of the memory device could set a register value to vary an attribute value for individual sense operations responsive to the sensed temperature. Table 2 extends the example of Table 1 to show how trim registers might be used to select attribute values for the sense operation as a function of the sensed temperature using a two-digit trim register, while Table 3 extends the example of Table 1 to show how trim registers might be used to select attribute values for the sense operation as a function of the calculated attribute value using a two-digit trim register. Note that while Table 3 depicts the selected attribute value as a function of the calculated attribute value, it remains a function of the sensed temperature as the calculated attribute value is a function of the sensed temperature.

TABLE 2

Register Values and Attribute Values (Y) as Function of Sensed Temperature (T)

| Sensed Temperature (T) | Register Value | Attribute Value (Y) |
|---|---|---|
| T1 <= T < T2 | 00 | Y1 |
| T2 <= T < T3 | 01 | Y2 |
| T3 <= T < T4 | 10 | Y3 |
| T4 <= T <= T5 | 11 | Y4 |

TABLE 3

Register Values and Attribute Values (Y) as Function of Calculated Attribute Value (Y')

| Calculated Attribute Value (Y') | Register Value | Attribute Value (Y) |
|---|---|---|
| Y'1 <= Y' < Y'2 | 00 | Y1 |
| Y'2 <= Y' < Y'3 | 01 | Y2 |
| Y'3 <= Y' < Y'4 | 10 | Y3 |
| Y'4 <= Y' <= Y'5 | 11 | Y4 |

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. An apparatus, comprising:
an array of memory cells;
a data line selectively connected to a memory cell of the array of memory cells;
a sense circuit, comprising:
  a sense node selectively connected to the data line;
  a precharge transistor connected between the sense node and a voltage node and having a control gate configured to receive a first control signal, a first source/drain connected to the sense node, and a second source/drain;
  a sense transistor connected between the voltage node and the second source/drain of the precharge transistor and having a control gate connected to the sense node, a first source/drain connected to the second source/drain of the precharge transistor, and a second source/drain; and
  a sense enable transistor connected between the voltage node and the second source/drain of the sense transistor and having a control gate configured to receive a second control signal, a first source/drain connected to the second source/drain of the sense transistor, and a second source/drain connected to the voltage node; and
a controller configured to perform a sense operation on a selected memory cell of the array of memory cells using the sense circuit, wherein the controller is further configured to selectively vary at least one attribute of the sense operation in response to an indication of a sensed temperature, the at least one attribute selected from a group consisting of a sense node develop time during the sense operation, a ratio of a deboost voltage level capacitively decoupled from the sense node to a boost voltage level capacitively coupled to the sense node during the sense operation, and a precharge voltage level of the sense node during the sense operation.

2. The apparatus of claim 1, further comprising:
a temperature sensor in communication with the controller for use in generating the indication of the sensed temperature.

3. The apparatus of claim 2, wherein the temperature sensor is internal to the apparatus.

4. The apparatus of claim 1, wherein the controller is further configured to vary the at least one attribute of the sense operation when the indication of the sensed temperature indicates a temperature in a particular range of temperatures.

5. The apparatus of claim 4, wherein the controller is further configured to vary the at least one attribute of the sense operation only when the indication of the sensed temperature indicates a temperature in one or more subsets of temperatures of the particular range of temperatures.

6. The apparatus of claim 1, wherein the controller is further configured to selectively vary the ratio of the deboost voltage level to the boost voltage level by fixing a value of one of the boost voltage level and the deboost voltage level, and varying the value of the other one of the boost voltage level and the deboost voltage level.

7. An apparatus, comprising:
an array of memory cells;
a data line selectively connected to a memory cell of the array of memory cells; and
a sense circuit, comprising:
  a sense node selectively connected to the data line;
  a precharge transistor connected between the sense node and a voltage node and having a control gate configured to receive a first control signal, a first source/drain connected to the sense node, and a second source/drain;
  a sense transistor connected between the voltage node and the second source/drain of the precharge transistor and having a control gate connected to the sense node, a first source/drain connected to the second source/drain of the precharge transistor, and a second source/drain connected to the voltage node; and
  a sense enable transistor connected between the second source/drain of the precharge transistor and an output of the sense circuit and having a control gate configured to receive a second control signal, a first source/drain connected to the second source/drain of the precharge transistor, and a second source/drain; and
a controller configured to perform a sense operation on a selected memory cell of the array of memory cells using the sense circuit, wherein the controller is further configured to selectively vary at least one attribute of the sense operation in response to an indication of a sensed temperature, the at least one attribute selected from a group consisting of a sense node develop time during the sense operation, a ratio of a deboost voltage level capacitively decoupled from the sense node to a boost voltage level capacitively coupled to the sense node during the sense operation, and a precharge voltage level of the sense node during the sense operation;
wherein the controller is further configured to vary the at least one attribute of the sense operation when the indication of the sensed temperature indicates a temperature in a particular range of temperatures.

8. The apparatus of claim 7, further comprising:
a temperature sensor in communication with the controller for use in generating the indication of the sensed temperature.

9. The apparatus of claim 8, wherein the temperature sensor is internal to the apparatus.

10. The apparatus of claim 7, wherein the controller is further configured to vary the at least one attribute of the sense operation only when the indication of the sensed temperature indicates a temperature in one or more subsets of temperatures of the particular range of temperatures.

11. The apparatus of claim 7, further comprising a latch connected between the output of the sense circuit and the second source/drain of the sense enable transistor.

12. An apparatus, comprising:
an array of memory cells;
a data line selectively connected to a memory cell of the array of memory cells; and
a sense circuit, comprising:
  a sense node selectively connected to the data line;
  a precharge transistor connected between the sense node and a voltage node and having a control gate configured to receive a first control signal, a first source/drain connected to the sense node, and a second source/drain;
  a sense transistor connected between the voltage node and the second source/drain of the precharge transistor and having a control gate connected to the sense node, a first source/drain connected to the second source/drain of the precharge transistor, and a second source/drain connected to the voltage node; and
  a sense enable transistor connected between the second source/drain of the precharge transistor and an output of the sense circuit and having a control gate configured to receive a second control signal, a first source/drain connected to the second source/drain of the precharge transistor, and a second source/drain; and
a controller configured to perform a sense operation on a selected memory cell of the array of memory cells using the sense circuit, wherein the controller is further configured to selectively vary at least one attribute of the sense operation in response to an indication of a sensed temperature, the at least one attribute selected from a group consisting of a sense node develop time during the sense operation, a ratio of a deboost voltage level capacitively decoupled from the sense node to a boost voltage level capacitively coupled to the sense node during the sense operation, and a precharge voltage level of the sense node during the sense operation;
wherein the controller is further configured to selectively vary the ratio of the deboost voltage level to the boost voltage level by fixing a value of one of the boost voltage level and the deboost voltage level, and varying the value of the other one of the boost voltage level and the deboost voltage level.

13. A method of operating a memory, comprising:
generating an indication of a sensed temperature; and
selectively varying a value of a precharge voltage level of a sense node during a sense operation of the memory;
wherein varying the value of the precharge voltage level comprises varying a voltage level of a control signal applied to a control gate of a transistor, having a first source/drain connected to the sense node and a second source/drain connected to a voltage node, in response to the indication of the sensed temperature.

14. A method of operating a memory, comprising:
generating an indication of a sensed temperature;
selectively varying a value of a precharge voltage level of a sense node during a sense operation of the memory; and
selectively varying a respective value of at least one attribute of the sense operation of the memory in response to the indication of the sensed temperature, the at least one attribute selected from a group consisting of a sense node develop time during the sense operation, and a ratio of a deboost voltage level capacitively decoupled from the sense node to a boost voltage level capacitively coupled to the sense node during the sense operation;
wherein varying the value of the precharge voltage level comprises varying a voltage level of a control signal applied to a control gate of a transistor, connected between and in series with the sense node and a voltage node, in response to the indication of the sensed temperature.

15. A method of operating a memory, comprising:
generating an indication of a sensed temperature and selectively varying a value of a precharge voltage level of a sense node during a sense operation of the memory;
wherein varying the value of the precharge voltage level comprises varying a voltage level of a control signal applied to a control gate of a transistor, connected between and in series with the sense node and a voltage node, in response to the indication of the sensed temperature; and
wherein varying the voltage level of the control signal comprises varying the voltage level of the control signal as a decreasing function of the sensed temperature.

16. A method of operating a memory, comprising:
generating an indication of a sensed temperature; and
selectively varying a value of a precharge voltage level of a sense node during a sense operation of the memory;
wherein varying the value of the precharge voltage level comprises varying a voltage level of a control signal applied to a control gate of a transistor, connected between and in series with the sense node and a voltage node, in response to the indication of the sensed temperature; and
wherein varying the voltage level of the control signal applied to the control gate of the transistor comprises applying a first voltage level to the control gate of the transistor when the indication of the sensed temperature indicates any temperature in a first range of temperatures, and applying a second voltage level, lower than the first voltage level, to the control gate of the transistor when the indication of the sensed temperature indicates any temperature in a second range of temperatures higher than the first range of temperatures.

17. A method of operating a memory, comprising:
generating an indication of a sensed temperature; and
selectively varying a value of a precharge voltage level of a sense node during a sense operation of the memory;
wherein varying the value of the precharge voltage level comprises varying a voltage level of a control signal applied to a control gate of a transistor, connected between and in series with the sense node and a voltage node, in response to the indication of the sensed temperature; and
wherein selectively varying the value of the precharge voltage level of the sense node comprises varying the value of the precharge voltage level of the sense node only when a temperature corresponding to the indication of the sensed temperature is lower than or higher than a particular range of temperatures.

* * * * *